(12) United States Patent
Chen

(10) Patent No.: US 9,439,248 B2
(45) Date of Patent: Sep. 6, 2016

(54) ELECTROLUMINESCENT DISPLAY SCREEN AND METHOD FOR PREPARING THE SAME, AND DISPLAY DEVICE

(71) Applicants: BOE TECHNOLOGY GROUP CO., LTD., Beijing (CN); ORDOS YUANSHENG OPTOELECTRONICS CO., LTD., Ordos (CN)

(72) Inventor: Junsheng Chen, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days.

(21) Appl. No.: 14/363,258

(22) PCT Filed: Dec. 13, 2013

(86) PCT No.: PCT/CN2013/089348
§ 371 (c)(1),
(2) Date: Jun. 5, 2014

(87) PCT Pub. No.: WO2015/014072
PCT Pub. Date: Feb. 5, 2015

(65) Prior Publication Data
US 2015/0223296 A1    Aug. 6, 2015

(30) Foreign Application Priority Data

Aug. 2, 2013 (CN) .......................... 2013 1 0334872

(51) Int. Cl.
*H05B 33/04* (2006.01)
*H01J 9/26* (2006.01)
(Continued)

(52) U.S. Cl.
CPC ........... *H05B 33/04* (2013.01); *H01L 51/5246* (2013.01); *H05B 33/10* (2013.01); *H05B 33/12* (2013.01)

(58) Field of Classification Search
CPC ...... H05B 33/04; H05B 33/10; H05B 33/12; H04L 1/5246
USPC ........................................................ 313/512
See application file for complete search history.

(56) References Cited

U.S. PATENT DOCUMENTS

| 2002/0047963 A1 | 4/2002 | Youn et al. |
| 2012/0048462 A1 | 3/2012 | Lee |
| 2012/0099061 A1 | 4/2012 | Lee |

FOREIGN PATENT DOCUMENTS

| CN | 1465038 A | 12/2003 |
| CN | 101009305 A | 8/2007 |

(Continued)

OTHER PUBLICATIONS

International Search Report and Written Opinion mailed Mar. 20, 2014 regarding PCT/CN2013/089348. Translation provided by Dragon Intellectual Property Law Firm.
(Continued)

*Primary Examiner* — Tracie Y Green
(74) *Attorney, Agent, or Firm* — Harness, Dickey & Pierce, P.L.C.

(57) ABSTRACT

The invention provides an electroluminescent display screen and a method for preparing the same, and a display device, by which an electroluminescent display screen can automatically screen the irradiation of a laser, so that a mask can be omitted, the requirement on the manufacture process can be lowered, the production cost can be reduced, and the production capacity can be increased. An electroluminescent display screen according to the invention includes: a back plane; a package substrate; and a luminescent layer and a frit sealant provided between the back plane and the package substrate. The electroluminescent display screen further comprises a light-shielding pattern layer for shielding the region other than the frit sealant when a laser irradiates on the frit sealant, which is formed on one side of the package substrate that faces the back plane.

10 Claims, 3 Drawing Sheets

(51) Int. Cl.
*H01L 51/52* (2006.01)
*H05B 33/10* (2006.01)
*H05B 33/12* (2006.01)

(56) References Cited

FOREIGN PATENT DOCUMENTS

| CN | 102089898 A | 6/2011 |
|---|---|---|
| CN | 103426903 A | 12/2013 |

OTHER PUBLICATIONS

Chinese Office Action mailed May 5, 2015 regarding Chinese Application No. 2013103348727 Translation provided by Dragon Intellectual Property Law Firm.

Second Office Action regarding Chinese application No. 201310334872.7, dated Aug. 3, 2015. Translation provided by Dragon Intellectual Property Law Firm.

ELECTROLUMINESCENT DISPLAY SCREEN AND METHOD FOR PREPARING THE SAME, AND DISPLAY DEVICE

CROSS REFERENCE TO RELATED APPLICATIONS

This application is the U.S. national phase of PCT Application No. PCT/CN2013/089348 filed on Dec. 13, 2013, which claims priority to Chinese Patent Application No. 201310334872.7 filed on Aug. 2, 2013, the disclosures of which are incorporated in their entirety by reference herein.

FIELD OF THE INVENTION

The present invention relates to the field of display technologies, and in particular, to an electroluminescent display screen and a method for preparing the same, and a display device.

DESCRIPTION OF THE PRIOR ART

Organic Light Emitting Diode (OLED) display is a self-luminescent display. In comparison with Liquid Crystal Display (LCD), OLED display needs no backlight source, thus OLED display is lighter and thinner; in addition, OLED display further has the advantages of high luminance, low power consumption, wide visual angle, high response speed and wide working temperature. Therefore, OLED display is more and more widely used in various high-performance display fields.

At present, the optimum package mode of OLED is frit sealant welding. Frit sealant welding has an excellent sealing performance and adhesion strength, and it can meet the process conditions for mass production.

An existing frit sealant packaging technology will be illustrated by taking a finished product of mobile phone as an example. Referring to FIG. 1, the structure of a finished product of mobile phone includes, from the bottom to the upper: a back plane 11, a frit sealant 12, a luminescent layer 13, a package substrate 14, a mobile phone black surround 15 and a cover plate glass 16. Referring to FIG. 2, in the existing frit sealant welding mode, a mask 17 shields a laser 18 so as to melt the frit sealant by laser irradiation at a location where frit sealant needs to be formed, thereby attaining the object of packaging the back plane and the package substrate and preventing the region other than the frit sealant from being damaged by the laser at the same time. In such a package mode, it requires to control the precision of the mask 17 and the alignment precision between the mask and the package substrate. As a result, the requirement on the manufacture process is enhanced, which causes the increasing of the cost and the lowering of the production capacity.

SUMMARY OF THE INVENTION

The embodiments of the invention provide an electroluminescent display screen and a method for preparing the same, and an electroluminescent display device, by which an electroluminescent display screen can automatically shield the irradiation of a laser, and no mask is required, so that the manufacturing process of the electroluminescent display screen can be simplified, the production efficiency can be improved, and the production cost can be reduced.

An electroluminescent display screen according to an embodiment of the invention comprises: a back plane; a package substrate; and a luminescent layer and a frit sealant provided between the back plane and the package substrate, and further comprises a light-shielding pattern layer for shielding the region other than the frit sealant when a laser irradiates on the frit sealant, which is formed on one side of the package substrate that faces the back plane.

In the embodiments of the invention, by forming, on one side of a package substrate that faces the back plane, a light-shielding pattern layer for shielding a region other than the frit sealant when a laser irradiates on the frit sealant, the electroluminescent display screen can be made to automatically shield the irradiation of a laser, so that a mask can be omitted, the requirement on the manufacture process can be lowered, the cost can be reduced, and the production capacity can be increased.

Preferably, the color of the light-shielding pattern layer is black. A black material has a function of shielding a laser, thus the light-shielding pattern layer may shield a region other than the frit sealant when a laser irradiates on the frit sealant, so that the electroluminescent display screen can be made to automatically shield the irradiation of a laser, a mask can be omitted, the requirement on the manufacture process can be lowered, the cost can be reduced, and the production capacity can be increased.

Preferably, the material of the light-shielding pattern layer is a metal material, carbon black or titanium black, thus the light-shielding pattern layer may shield a region other than the frit sealant when a laser irradiates on the frit sealant, so that the electroluminescent display screen can be made to automatically shield the irradiation of a laser, a mask can be omitted, the requirement on the manufacture process can be lowered, the cost can be reduced, and the production capacity can be increased.

Preferably, the metal material is aluminum, manganese, chromium, an oxide of chromium or a nitride of chromium, thus the light-shielding pattern layer may shield a region other than the frit sealant when a laser irradiates on the frit sealant, so that the electroluminescent display screen can be made to automatically shield the irradiation of a laser, a mask can be omitted, the requirement on the manufacture process can be lowered, the cost can be reduced, and the production capacity can be increased.

Preferably, the light-shielding pattern layer comprises a first annular region and a second annular region, wherein the frit sealant surrounds the first annular region, and the second annular region surrounds the frit sealant.

Preferably, the distance between the outmost side edge of the first annular region and the inmost side edge of the second annular region is in a range of 0.6 mm to 1.2 mm, thus the distance between the first annular region and the second annular region is larger than the coating width of the frit sealant, and it is convenient for the packaging of the back plane the package substrate.

Preferably, the distance between the inmost side edge of the first annular region and the outmost side edge of the second annular region is a sum of the width of the used laser beam and the laser alignment precision.

An electroluminescent display device according to an embodiment of the invention comprises the above electroluminescent display screen.

A method for preparing an electroluminescent display screen according to an embodiment of the invention, which comprises:

forming a luminescent layer on a back plane;

forming, on one side of a package substrate that faces the back plane, a light-shielding pattern layer for shielding a region other than the frit sealant when a laser irradiates on the frit sealant;

forming a frit sealant on one side of the back plane that faces the package substrate or on one side of the package substrate that faces the back plane; and irradiating the frit sealant through a laser from one side of the package substrate that is away from the back plane, and packaging the package substrate and the back plane.

It may be seen from the above preparation method that, by forming, on one side of a package substrate that faces the back plane, a light-shielding pattern layer for shielding a region other than the frit sealant when a laser irradiates on the frit sealant, the electroluminescent display screen can be made to automatically shield the irradiation of a laser, so that a mask can be omitted, the requirement on the manufacture process can be lowered, the cost can be reduced, and the production capacity can be increased.

Preferably, the forming, on one side of a package substrate that faces the back plane, a light-shielding pattern layer for shielding a region other than the frit sealant when a laser irradiates on the frit sealant comprises: forming by a patterning process, on one side of a package substrate that faces the back plane, a light-shielding pattern layer for shielding a region other than the frit sealant when a laser irradiates on the frit sealant.

Thus, the electroluminescent display screen can be made automatically shield the irradiation of a laser, so that a mask can be omitted, the requirement on the manufacture process can be lowered, the cost can be reduced, and the production capacity can be increased.

Preferably, the forming by a patterning process, on one side of a package substrate that faces the back plane, a light-shielding pattern layer for shielding a region other than the frit sealant when a laser irradiates on the frit sealant specifically comprises:

coating a light-shielding pattern layer material on one side of the package substrate that faces the back plane;

coating a photoresist on the light-shielding pattern layer material, and exposing and developing the photoresist to form a first photoresist-removed region at a location on the package substrate that corresponds to the frit sealant, form a first photoresist-reserved region inside the frit sealant region, form a second photoresist-reserved region outside the frit sealant region, and form a second photoresist-removed region inside the first photoresist-reserved region; and etching the light-shielding pattern layer material in the photoresist-removed region and peeling off the photoresist, and obtaining the light-shielding pattern layer consisted of a first annular region inside the frit sealant region and a second annular region outside the frit sealant region.

Thus, a light-shielding pattern layer for shielding a region other than the frit sealant when a laser irradiates on the frit sealant may be formed, so that the electroluminescent display screen can be made to automatically shield the irradiation of a laser, a mask can be omitted, the requirement on the manufacture process can be lowered, the cost can be reduced, and the production capacity can be increased.

DETAILED DESCRIPTION OF THE PREFERRED EMBODIMENTS

The embodiments of the invention provide an electroluminescent display screen and a method for preparing the same, and an electroluminescent display device, by which an electroluminescent display screen can automatically shield the irradiation of a laser, so that a mask can be omitted, the requirement on the manufacture process can be lowered, the cost can be reduced, and the production capacity can be increased.

The technical solutions in the embodiments of the invention will be described clearly and fully below in conjunction with the drawings in the embodiments of the invention. Apparently, the embodiments described are only a part of the embodiments of the invention, rather than the whole embodiments. Other embodiments obtained by those skilled in the art based on the embodiments of the invention without creative work all belong to the protection scope of the invention.

An embodiment of the invention provides an electroluminescent display screen, where the electroluminescent display screen may be an organic electroluminescent display screen or an inorganic electroluminescent display screen, which is not specifically limited in the invention.

Figure 1:
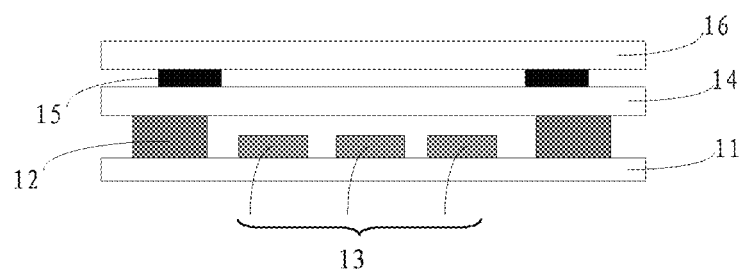
FIG. 1 is a schematic diagram showing the package structure of a finished product of mobile phone in the prior art.
Figure 2:
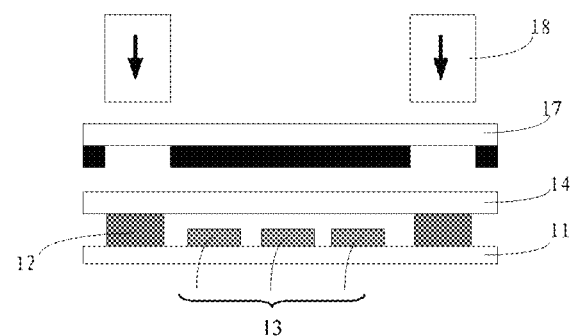
FIG. 2 is a schematic diagram showing the packaging process of a finished product of mobile phone in the prior art.
Figure 3:
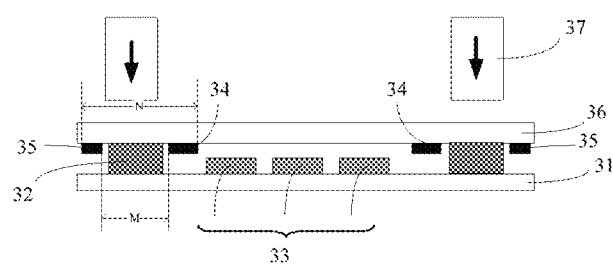
FIG. 3 is a schematic diagram showing the sectional structure of an electroluminescent display screen according to an embodiment of the invention.

One specific embodiment will be illustrated below by taking an organic electroluminescent display screen as an example, as shown in FIG. 3. An embodiment of the invention provides an electroluminescent display screen, and it may be seen that the electroluminescent display screen includes, from the bottom to the upper: a back plane 31, a frit sealant 32, a luminescent layer 33, a first annular region 34 of a light-shielding pattern layer, a second annular region 35 of a light-shielding pattern layer, and a package substrate 36.

Wherein the back plane 31 and the package substrate 36 may be substrates of the same type or substrates of different materials, for example, glass substrate and quartz substrate, etc.

Preferably, a thin-film transistor and a driving circuit may also exist between the back plane 31 and the package substrate 36, for controlling the display of the electroluminescent display screen.

Figure 4:
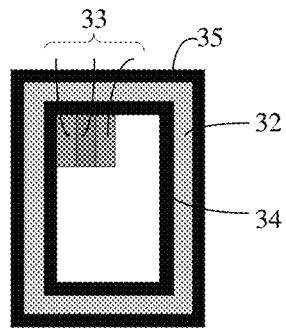
FIG. 4 is a schematic diagram showing the planar structure of an electroluminescent display screen according to an embodiment of the invention.

Specifically, the luminescent layer 33 and the frit sealant 32 are provided between the back plane 31 and the package substrate 36. The luminescent layer 33 is formed on one side of the back plane 31 that faces the package substrate 36, and it may not contact the package substrate 36, while the frit sealant 32 contacts both the back plane 31 and the package substrate 36, for packaging the back plane 31 and the package substrate 36. The light-shielding pattern layer is divided into a first annular region 34 and a second annular region 35, and formed on one side of the package substrate 36 that faces the back plane 31. The frit sealant 32 surrounds the first annular region 34 of the light-shielding pattern layer, and the second annular region 35 of the light-shielding pattern layer surrounds the frit sealant 32, that is, the first annular region 34 is located inside the frit sealant 32, and the second annular region 35 is located outside the frit sealant, and specifically, reference may be made to FIG. 4. In addition to functioning as a barrier layer for laser irradiation, the first annular region 34 may also functions as a black frame on the cover plate of the display screen at the same time, which is used for defining a display region. By forming a light-shielding pattern layer on the package substrate 36, the step of forming a black frame on the cover plate of a product such as a mobile phone may be omitted, and the process may be simplified, and at the same time, the cost may be saved. The annular region refers to an annular region formed along the periphery of the package substrate, and it may be closed or unclosed, which is not limited in the invention.

It should be noted that, for convenient illustration, only the luminescent layers of three subpixels are shown in the display region of the electroluminescent display screen, for example, the luminescent layers of red, green and blue subpixels. It may be understood that, a plurality of subpixels may be included in a practical electroluminescent display screen, wherein the subpixels may be subpixels of the colors other than red, green and blue, and different arrangement structures may be formed; these subpixels constitute a pixel unit, and at the same time, each subpixel further includes a thin-film transistor switching element, an electrode structure, a gate line, a data line and other film structures connected therewith, wherein these structures are the same as those of the prior art, and no further description will be given again here.

The luminescent layer 33 may be a red, green or blue luminescent layer, or it may be a white light luminescent layer, or a combined luminescent layer of complementary colors such as blue and yellow.

The light-shielding pattern layer is used for shielding the region other than the frit sealant 32 when a laser irradiates on the frit sealant 32. Specifically, the region other than the frit sealant 32 refers to the region on one side of the back plane 31 that faces the package substrate 36 except for the frit sealant 32, it may be a partial region or the whole region. Because the irradiation range of a laser beam is limited, it only needs to shield the periphery of the region of the frit sealant 32. Thus, by shielding the region other than the frit sealant 32 through the light-shielding pattern layer when a laser irradiates on the frit sealant 32, the back plane 31 and the package substrate 36 may be packaged.

The color of the light-shielding pattern layer is black, and the material thereof may be a metal material, for example, aluminum, manganese and chromium, or it may be titanium black or carbon black. It should be noted that, the metal material not only includes a metal, for example, manganese and chromium, etc., but also includes a metal oxide and a metal nitride, etc., for example, an oxide of chromium or a nitride of chromium.

Specifically, the range M of the distance between the first annular region 34 of the light-shielding pattern layer and the second annular region 35 of the light-shielding pattern layer, i.e., the distance between the outmost side edge of the first annular region 34 and the inmost side edge of the second annular region 35, is in the range of 0.6 mm to 1.2 mm; that is, the distance between the outmost side edge of the first annular region 34 and the inmost side edge of the second annular region 35 is no less than the region width of the frit sealant. The distance N between the inmost side edge of the first annular region 34 and the outmost side edge of the second annular region 35 is a sum of the width of the laser beam and the laser alignment precision, that is, the laser beam can only irradiates on the region of the frit sealant 32 or on the first annular region 34 and the second annular region 35 in a permissible error range of the precision thereof, i.e., the distance range N as shown in FIG. 3.

An electroluminescent display device that employs the above electroluminescent display screen may be an organic electroluminescent display device or an inorganic electroluminescent display device, which may be any device for displaying, for example, TV set, mobile phone, computer and digital camera, etc. Because the electroluminescent display device employs the above electroluminescent display screen, the packaging stability is strong, the reliability is high, the cost is low, and the production capacity is high. Thus, the display quality and the service life of the electroluminescent display device can be improved, the cost can be lowered, and the production capacity can be increased at the same time.

Figure 5:
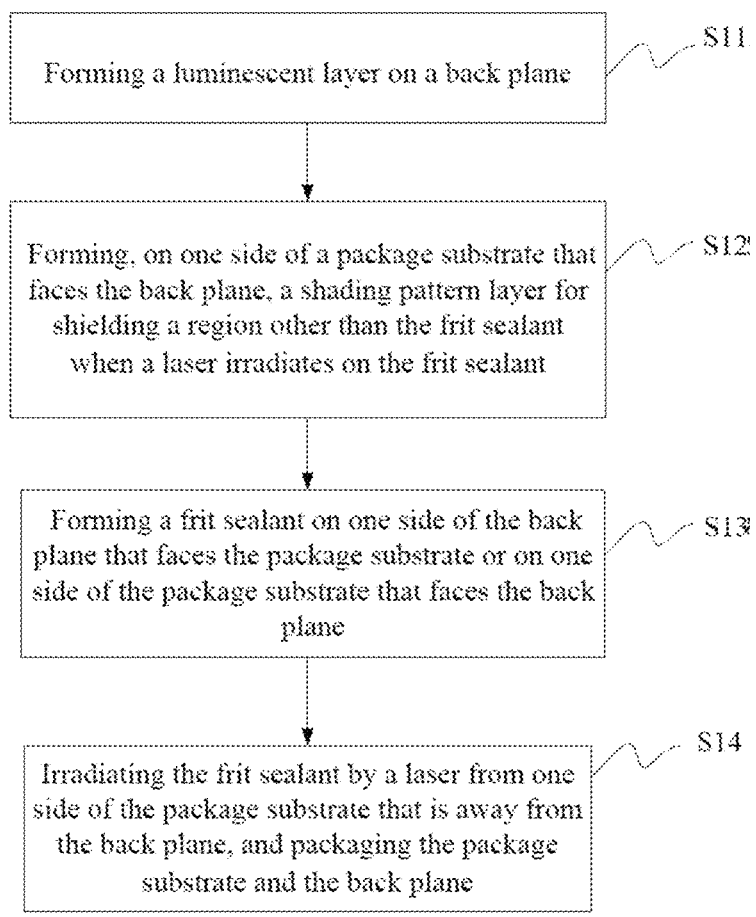
FIG. 5 is a schematic flow chart of a preparation method of an electroluminescent display screen according to an embodiment of the invention.

An embodiment of the invention further provides a method for preparing an electroluminescent display screen, referring to FIG. 5, which includes:

S11: forming a luminescent layer on a back plane;

S12: forming, on one side of a package substrate that faces the back plane, a light-shielding pattern layer for shielding a region other than the frit sealant when a laser irradiates on the frit sealant;

S13: forming a frit sealant on one side of the back plane that faces the package substrate or on one side of the package substrate that faces the back plane; and S14: irradiating the frit sealant by a laser from one side of the package substrate that is away from the back plane, and packaging the package substrate and the back plane.

It should be noted that the above steps are only some steps included in a method for preparing an electroluminescent display screen, and the orders thereof are not limited thereto. For example, the frit sealant may be formed before the forming of the light-shielding pattern layer, and in addition to the above steps, the method may further include other steps, for example, the steps of forming a thin-film transistor and a driving circuit. The frit sealant may be preformed on one side of the back plane that faces the package substrate or on one side of the package substrate that faces the back plane. Laser irradiation is carried out from one side of the package substrate that is away from the back plane, and the light-shielding pattern layer preformed on the package substrate may function as a mask, so that the laser only acts on the preformed frit sealant, thereby the package substrate and the back plane are packaged and connected.

The luminescent layer may be a red, green or blue luminescent layer, or it may be a white light luminescent layer, or a combined luminescent layer of complementary colors such as blue and yellow, which is not limited in the invention.

The material of the package substrate may be the same as or different from that of the back plane, and it may be glass and quartz, etc.

Preferably, a thin-film transistor and a driving circuit may also be provided between the back plane and the package substrate, for controlling the display of the electroluminescent display screen.

The step of forming, on one side of a package substrate that faces the back plane, a light-shielding pattern layer for shielding a region other than the frit sealant when a laser irradiates on the frit sealant includes:

forming a light-shielding pattern layer for shielding a region other than the frit sealant when a laser irradiates on the frit sealant on one side of a package substrate that faces the back plane through a patterning process.

The patterning process may be a patterning process that includes exposing, developing and etching, etc., or it may be other processes for forming a pattern with a certain shape. The light-shielding pattern layer is used for shielding a region other than the frit sealant when a laser irradiates on the frit sealant; specifically, the region other than the frit sealant refers to all or a part of the region on one side of the back plane that faces the package substrate, except for the frit sealant. Because the irradiation range of a laser beam is limited, it only needs to shield on the periphery of the region of the frit sealant. Thus, the region other than the frit sealant is shielded by the light-shielding pattern layer when a laser irradiates on the frit sealant, so that the back plane and the package substrate can be packaged.

Figure 6:
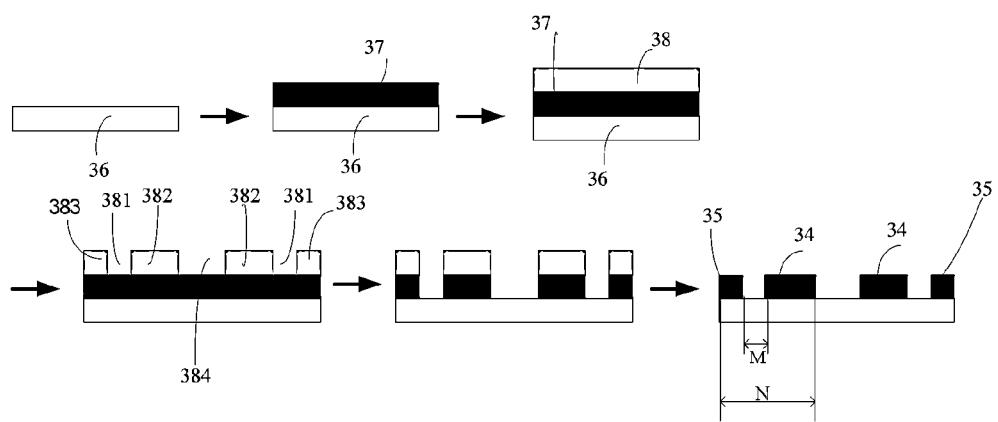
FIG. 6 is a schematic flow chart of a process for preparing a light-shielding pattern layer according to an embodiment of the invention.

Referring to FIG. 6, the step of forming a light-shielding pattern layer for shielding a region other than the frit sealant when a laser irradiates on the frit sealant on one side of a package substrate that faces the back plane through a patterning process includes:

coating a light-shielding pattern layer material 37 on one side of the package substrate 36 that faces the back plane 31 (the top surface of the package substrate 36 shown in FIG. 6), wherein the material thereof may be a metal material, for example, aluminum, manganese, chromium, an oxide of chromium or a nitride of chromium, or it may be titanium black or carbon black;

coating a photoresist 38 on the light-shielding pattern layer material 37, and exposing and developing the photoresist 38 to form a first photoresist-removed region 381 at a location on the package substrate 36 that corresponds to the frit sealant 32, form a first photoresist-reserved region 382 inside the frit sealant region, form a second photoresist-reserved region 383 outside the frit sealant region, and form a second photoresist-removed region 384 inside the first photoresist-reserved region; and etching the light-shielding pattern layer material 37 in the photoresist-removed region, then peeling off the photoresist, and obtaining the light-shielding pattern layer consisted of the first annular region 34 inside the frit sealant region and the second annular region 35 outside the frit sealant region.

The first photoresist-removed region 381 corresponds to the region that forms the frit sealant, and the light-shielding pattern layer here is removed by etching, which is convenient for a laser to irradiate on the frit sealant so as to package and connect the package substrate and the back plane; the second photoresist-removed region 384 corresponds to the display region, and a luminescent layer is formed in the display region for the electroluminescent display screen to display. Because the irradiation range of a laser beam is limited, it will not be irradiated by the laser here, thus no light-shielding pattern layer needs to be formed.

The range M of the distance between the first annular region 34 of the light-shielding pattern layer and the second annular region 35 of the light-shielding pattern layer, i.e., the distance between the outmost side edge of the first annular region 34 and the inmost side edge of the second annular region 35, is in the range of 0.6 mm to 1.2 mm. That is, the distance between the first annular region 34 of the light-shielding pattern layer and the second annular region 35 of the light-shielding pattern layer is no less than the width of the forming region of the frit sealant. The distance N between the inmost side edge of the first annular region 34 and the outmost side edge of the second annular region 35 is a sum of the width of the laser beam and the laser alignment precision. That is, the laser beam can only irradiates on the region of the frit sealant or on the first annular region 34 and the second annular region 35 in a permissible error range of the precision thereof, i.e., the distance range N shown in FIG. 6.

The inside of the frit sealant region refers to the side that is adjacent to the display region, and the outside of the frit sealant region refers to the side that is adjacent to the edge region of the substrate.

Apparently, various modifications and variations may be made on the invention by one skilled in the art without departing from the spirit and scope of the invention. Thus, if these modifications and variations on the invention fall within the scope of the appended claims and their equivalents, the invention also intends to cover such modifications and variations.

What is claimed is:

1. An electroluminescent display screen, comprising: a back plane; a package substrate; and a luminescent layer and a frit sealant provided between the back plane and the package substrate, wherein the electroluminescent display screen further comprises a light-shielding pattern layer for shielding the region other than the frit sealant when a laser irradiates on the frit sealant, which is formed on one side of the package substrate that faces the back plane, wherein the light-shielding pattern layer comprises the first annular region and the second annular region, and wherein, the frit sealant surrounds the first annular region, and the second annular region surrounds the frit sealant, wherein a distance between an outmost side edge of a first annular region and an inmost side edge of a second annular region is in a range of 0.6 mm to 1.2 mm, wherein a distance between an inmost side edge of the first annular region and an outmost side edge of the second annular region is a sum of a width of a laser beam and a laser alignment precision, wherein the first annular region is located inside the frit sealant, and the second annular region is located outside the frit sealant, the first annular region functions as a barrier layer for laser irradiation and as a black frame on the cover plate of the display screen, and is used for defining a display region.

2. The electroluminescent display screen according to claim 1, wherein a color of the light-shielding pattern layer is black.

3. The electroluminescent display screen according to claim 2, wherein a material of the light-shielding pattern layer is a metal material, carbon black or titanium black.

4. The electroluminescent display screen according to claim 3, wherein the metal material is aluminum, manganese, chromium, an oxide of chromium or a nitride of chromium.

5. An electroluminescent display device, comprising the electroluminescent display screen according to claim 1.

6. A method for preparing an electroluminescent display screen, comprising:

forming a luminescent layer on a back plane;

forming, on one side of a package substrate that faces the back plane, a light-shielding pattern layer for shielding a region other than a frit sealant when a laser irradiates on the frit sealant;

forming a frit sealant on one side of the back plane that faces the package substrate or on one side of the package substrate that faces the back plane;

irradiating the frit sealant through a laser from one side of the package substrate that is away from the back plane, and packaging the package substrate and the back plane, 1wherein the light-shielding pattern layer comprises the first annular region and the second annular region, and wherein, the frit sealant surrounds the first annular region, and the second annular region surrounds the frit sealant, wherein a distance between an outmost side edge of a first annular region and an inmost side edge of a second annular region is in a range of 0.6 mm to 1.2 mm, and wherein a distance between an inmost side edge of the first annular region and an outmost side edge of the second annular region is a sum of a width of a laser beam and a laser alignment precision, wherein the first annular region is located inside the frit sealant, and the second annular region is located outside the frit sealant, the first annular region functions as a barrier layer for laser irradiation and as a black frame on the cover plate of the display screen, and is used for defining a display region.

7. The method according to claim 6, wherein the forming, on one side of a package substrate that faces the back plane, a light-shielding pattern layer for shielding a region other than the frit sealant when a laser irradiates on the frit sealant comprises:

forming a light-shielding pattern layer for shielding a region other than the frit sealant when a laser irradiates on the frit sealant on one side of a package substrate that faces the back plane through a patterning process.

8. The method according to claim 7, wherein the forming a light-shielding pattern layer for shielding a region other than the frit sealant when a laser irradiates on the frit sealant on one side of a package substrate that faces the back plane through a patterning process comprises:

coating a material of the light-shielding pattern layer on one side of the package substrate that faces the back plane;

coating a photoresist on the material of the light-shielding pattern layer, and exposing and developing the photoresist to form a first photoresist-removed region in the region of the package substrate that corresponds to the frit sealant, form a first photoresist-reserved region inside a frit sealant region, form a second photoresist-reserved region outside the frit sealant region, and form a second photoresist-removed region inside the first photoresist-reserved region; and etching the material of the light-shielding pattern layer in the photoresist-removed region and peeling off the photoresist, and obtaining the light-shielding pattern layer consisted of the first annular region inside the frit sealant region and the second annular region outside the frit sealant region.

9. The electroluminescent display screen according to claim 2, wherein there is no black light-shielding pattern layer in the display region of the electroluminescent display screen.

10. The electroluminescent display screen according to claim 1, wherein the luminescent layer is a red-green-blue luminescent layer.

* * * * *